(12) United States Patent
Kim et al.

(10) Patent No.: US 9,740,036 B2
(45) Date of Patent: Aug. 22, 2017

(54) DISPLAY DEVICE AND MANUFACTURING METHOD OF THE SAME

(71) Applicant: Samsung Display Co., Ltd., Yongin-si, Gyeonggi-do (KR)

(72) Inventors: Yu Jin Kim, Hwaseong-si (KR); You Young Jin, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 20 days.

(21) Appl. No.: 14/870,358

(22) Filed: Sep. 30, 2015

(65) Prior Publication Data

US 2016/0195787 A1    Jul. 7, 2016

(30) Foreign Application Priority Data

Jan. 5, 2015 (KR) .................. 10-2015-0000718

(51) Int. Cl.
*G02F 1/1333* (2006.01)
*H01L 27/12* (2006.01)
*G02F 1/1341* (2006.01)
*G02F 1/1362* (2006.01)
*G02F 1/1345* (2006.01)

(52) U.S. Cl.
CPC ...... *G02F 1/133377* (2013.01); *H01L 27/124* (2013.01); *H01L 27/1262* (2013.01); *G02F 1/1341* (2013.01); *G02F 1/1345* (2013.01); *G02F 1/136209* (2013.01)

(58) Field of Classification Search
CPC ............. G02F 1/133377; G02F 1/1345; G02F 1/136209; G02F 1/1341; H01L 27/1262; H01L 27/124
See application file for complete search history.

(56) References Cited

U.S. PATENT DOCUMENTS

| 8,115,376 B2 * | 2/2012 | Fujioka ............... H01L 51/5212 313/498 |
| 8,248,329 B2 | 8/2012 | Yamamoto et al. |
| 8,493,531 B2 | 7/2013 | Shimada et al. |
| 2009/0079920 A1 | 3/2009 | Aoki |
| 2015/0002801 A1 | 1/2015 | Kim et al. |

FOREIGN PATENT DOCUMENTS

| KR | 1020040087451 A | 10/2004 |
| KR | 1020060018312 A | 3/2006 |
| KR | 100774257 B1 | 11/2007 |
| KR | 1020120026880 A | 3/2012 |

* cited by examiner

*Primary Examiner* — Donald Raleigh
*Assistant Examiner* — Kevin Quarterman
(74) *Attorney, Agent, or Firm* — Cantor Colburn LLP (57) ABSTRACT

A display device includes: display and peripheral regions, the peripheral region including: a first wire on a first insulating layer; a passivation layer on the first insulating layer, exposing a portion of the first wire; a light blocking member on the passivation layer, a first hole therein exposing the portion of the first wire; a second insulating layer on the light blocking member, a second hole therein exposing the portion of the first wire; a third insulating layer on the second insulating layer, covering sides of the light blocking member and the second insulating layer at the first and second holes; and a second wire on the third insulating layer, in contact with the first wire. The second insulating layer at the second hole exposes an upper surface of the light blocking member at the first hole

19 Claims, 8 Drawing Sheets

DISPLAY DEVICE AND MANUFACTURING METHOD OF THE SAME

This application claims priority to Korean Patent Application No. 10-2015-0000718 filed on Jan. 5, 2015, and all the benefits accruing therefrom under 35 U.S.C. §119, the entire contents of which are incorporated herein by reference.

BACKGROUND (a) Field

The invention relates to a display device and a manufacturing method of the same.

(b) Description of the Related Art

A liquid crystal display, which is one of the most widely used flat panel displays, includes two sheets of display panels on which electric field generating electrodes such as pixel electrodes, common electrodes, and the like are disposed and a liquid crystal layer interposed therebetween. The liquid crystal display displays an image by applying a voltage to the electric field generating electrodes to generate an electric field on the liquid crystal layer and consequently, determining an orientation of liquid crystal molecules of the liquid crystal layer and controlling polarization of incident light.

The two sheets of display panels of the liquid crystal display may include a thin film transistor display panel and a counter display panel. The thin film transistor display panel includes disposed therein a gate line transferring a gate signal and a data line transferring a data signal, the gate line and the data line intersecting with each other. The thin film transistor display panel may be provided with a thin film transistor connected to the gate line and the data line, the pixel electrode connected to the thin film transistor, and the like. The counter display panel may have include disposed therein a light blocking member, a color filter, a common electrode, and the like. In some liquid crystal displays, the light blocking member, the color filter, and the common electrode may also be disposed in the thin film transistor display panel.

SUMMARY

In an attempt to reduce costs for a display panel of a display device, disposing the respective components of a liquid crystal display in a single display panel such as on a single sheet of substrate within the display panel has been examined. The above-mentioned liquid crystal display is a display device which may be manufactured by disposing a sacrificial material layer including an organic material, or the like, on a substrate, disposing a roof layer on the sacrificial layer and then removing the sacrificial layer to form a microcavity. A liquid crystal may be disposed in the microcavity formed by the removal of the sacrificial layer.

In the process of removing the sacrificial layer, a problem exists in that the sacrificial layer on an insulating component layer in a peripheral region of the display panel may not be completely or accurately removed. That is, where the sacrificial layer is not completely or accurately removed, a portion thereof undesirably remains due to a shape of the insulating component layer in the peripheral region.

One or more exemplary embodiment of the invention provides a display device and a manufacturing method of the same having advantages of effectively completely and accurately removing a sacrificial layer such that a portion of the sacrificial layer does not remain on an insulating component layer of the display panel in a peripheral region of the display panel, after performing a process of removing the sacrificial layer.

An exemplary embodiment provides a display device including: a substrate including a display region which displays an image and a peripheral region positioned around the display region; the peripheral region of the substrate includes disposed therein: a first peripheral insulating layer on the substrate; a first peripheral wire on the first peripheral insulating layer; a peripheral passivation layer on the first peripheral insulating layer, the peripheral passivation layer exposing a portion of the first peripheral wire; a light blocking member on the peripheral passivation layer, in which is defined a first exposure hole which exposes the portion of the first peripheral wire exposed by the peripheral passivation layer; a second peripheral insulating layer on the light blocking member, in which is defined a second exposure hole which exposes the portion of the first peripheral wire exposed by the peripheral passivation layer and the light blocking member; a third peripheral insulating layer on the second peripheral insulating layer, covering sides of the light blocking member and the second peripheral insulating layer exposed at the first and second exposure holes; and a second peripheral wire on the third peripheral insulating layer, in contact with the first peripheral wire. The second peripheral insulating layer at the second exposure hole exposes an upper surface of the light blocking member adjacent to the first exposure hole.

In a plan view, the first exposure hole may be positioned within the second exposure hole.

A width of the upper surface of the light blocking member exposed by the second peripheral insulating layer may be about 10 micrometers (μm) to about 20 μm.

The first peripheral wire may be a common voltage line.

The second peripheral wire may be connected to a common electrode of the display region.

The second peripheral wire may include a transparent metal material.

The second peripheral wire may include an organic insulating material.

The second peripheral wire may be electrically connected to the portion of the first peripheral wire exposed by each of the peripheral passivation layer, the light blocking member and the second peripheral insulating layer.

The display region of the substrate may include: a thin film transistor formed on the substrate; a pixel electrode connected to the thin film transistor; a roof layer on the pixel electrode so as to be spaced apart from the pixel electrode; a plurality of microcavities between the spaced apart roof layer and pixel electrode; an injection hole exposing an inner area of the microcavities; a liquid crystal layer within the microcavities; and an overcoat on the roof layer, extending to cover the injection hole and seal the microcavities.

Another exemplary embodiment provides a manufacturing method of a display device including: preparing a substrate including a display region which displays an image and a peripheral region positioned around the display region; and in the peripheral region of the substrate: forming a first peripheral insulating layer on the substrate; forming a first peripheral wire on the first peripheral insulating layer; forming a peripheral passivation layer on the first peripheral insulating layer, the peripheral passivation layer exposing a portion of the first peripheral wire; forming a light blocking member in which is defined a first exposure hole exposing the portion of the first peripheral wire exposed by the peripheral passivation layer, on the peripheral passivation layer; forming a second peripheral insulating layer in which is defined a second exposure hole exposing the portion of the first peripheral wire exposed by the peripheral passivation layer and the light blocking member, on the light blocking member; forming a sacrificial layer on the peripheral insulating layer and the light blocking member each on the peripheral passivation layer; removing the sacrificial layer on the peripheral insulating layer, the light blocking member and the peripheral passivation layer; forming a third peripheral insulating layer on the second peripheral insulating layer, the third peripheral insulating layer covering sides of the light blocking member and the second peripheral insulating layer exposed at the first and second exposure holes; and forming a second peripheral wire on the third peripheral insulating layer, the second peripheral wire in contact with the first peripheral wire. The second peripheral insulating layer at the second exposure hole exposes an upper surface of the light blocking member adjacent to the first exposure hole.

In a plan view, the first exposure hole may be positioned within the second exposure hole.

A width of the upper surface of the light blocking member exposed by the second peripheral insulating layer may be about 10 μm to about 20 μm.

The first peripheral wire may be a common voltage line.

The second peripheral wire may be connected to a common electrode of the display region.

The second peripheral wire may be electrically connected to the portion of the first peripheral wire exposed by each of the peripheral passivation layer, the light blocking member and the second peripheral insulating layer.

According to one or more exemplary embodiment of the invention, even after the process of removing the sacrificial layer is performed in the display and peripheral regions, the sacrificial layer does not remain on the insulating layer in the peripheral region and may be completely removed therefrom, due to the shape and/or profile of the insulating layer in the peripheral region on which the sacrificial layer is stacked.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Exemplary embodiments will be described in detail with reference to the accompanying drawings. However, the invention is not limited to the exemplary embodiments which are described herein, and may be modified in various different ways. Rather, the exemplary embodiments to be described below are provided so that the idea can be sufficiently transferred to those skilled in the art to which the invention pertains.

In the drawings, thicknesses of layers and regions are exaggerated for clarity. In addition, where it is stated that a layer is present 'on' another layer or a substrate, the layer may be directly on another layer or the substrate or have the other layer interposed therebetween. Portions denoted by like reference numerals mean like elements throughout the specification.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. As used herein, "connected" or "contacted" may indicate a physical and/or electrical connection or contact.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Referring to FIGS. 1 to 6, in an exemplary embodiment of a display device according to the invention, a second peripheral insulating layer 240a in a peripheral region of the display device exposes a portion of an upper surface of a light blocking member 220a which is adjacent to a first exposure hole 221 exposing a portion of a first peripheral wire 300. Thereby, even when a sacrificial layer 700 is removed during a process of manufacturing the display device, the sacrificial layer 700 does not remain on a peripheral passivation layer 180a in the peripheral region of the display device. A detailed description thereof will be provided below.

First, a structure of a display device will be described with reference to FIGS. 1 and 5.

Figure 1:
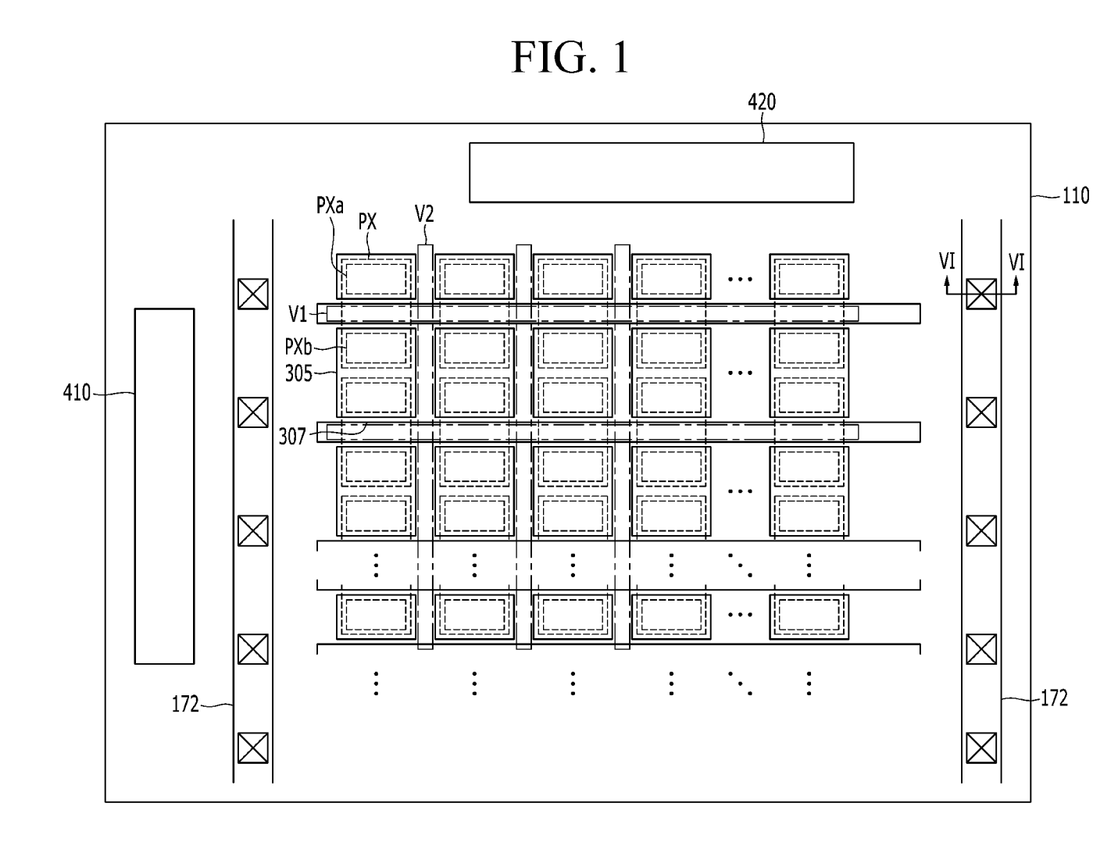
FIG. 1 is a plan view showing an exemplary embodiment of a display device according to the invention.

Referring to FIG. 1, an exemplary embodiment of the display device according to the invention includes a substrate 110 including a material such as glass, plastic, or the like.

A microcavity 305 covered by a roof layer 360 is disposed or formed on the substrate 110. The roof layer 360 (see FIG. 4) is elongated to extend in a row direction in the plan view, and a plurality of microcavities 305 are defined below one continuous roof layer 360.

The microcavities 305 may be disposed in a matrix shape. In defining the matrix shape, a first valley V1 is defined between the microcavities 305 which are adjacent to each other in a column direction, and a second valley V2 is positioned between the microcavities 305 which are adjacent to each other in a row direction. The collection of the valleys V1 and V2 and the microcavities 205 define the matrix shape in the plan view.

A plurality of roof layer 360 portions is separated from each other while having the first valley V1 therebetween. At the first valley V1, the microcavity 305 is not covered or overlapped by the roof layer 360 such that an inner area of the microcavity 305 is exposed to outside the microcavity 305. Injection holes 307 at portions where the inner area of the microcavity 305 is exposed to outside thereof.

The injection holes 307a and 307b are defined or formed at outer edges of both of opposing sides of the microcavity 305. The injection holes 307a and 307b include a first injection hole 307a and a second injection hole 307b. The first injection hole 307a is disposed at a side of a first edge of the microcavity 305 to expose the inner area of the microcavity 305 and the second injection hole 307b is disposed at a side of a second edge of the microcavity 305 to expose the inner area of the same microcavity 305. The side of the first edge and the side of the second edge of the microcavity 305 are opposite to each other.

The roof layer 360 is disposed so as to be spaced apart from the substrate 110 and elongated between the second valleys V2 that are adjacent to each other, thereby overlapping the microcavity 305 disposed between the second valleys V2 adjacent to each other. The roof layer 360 is further extended from overlapping the microcavity 305 so as to cover sides of the microcavity 305, except for the side of the first edge and the side of the second edge in which the injection holes 307a and 307b are defined. The plurality of roof layer 360 portions separated from each other while having the first valley V1 therebetween are connected to each other by the portion of the roof layer 360 elongated between the second valleys V2 adjacent to each other.

The structure of the display device described above is merely illustrative and may be variously modified. In an alternative exemplary embodiment, for example, the layout of the microcavity 305, the first valley V1 and the second valley V2 may be changed, the plurality of roof layer 360 portions may be separated from each other while having the second valley V2 therebetween and connected to each other by a portion of the roof layer 360 elongated between the first valleys V1 adjacent to each other. Also, the roof layer 360 portions are disposed so as to be spaced apart from the substrate 110 at a portion of the second valley V2, such that the microcavities 305 that are adjacent to each other may also be continuously connected to each other.

Hereinafter, one pixel of a display device will be schematically described with reference to FIG. 2.

Figure 2:
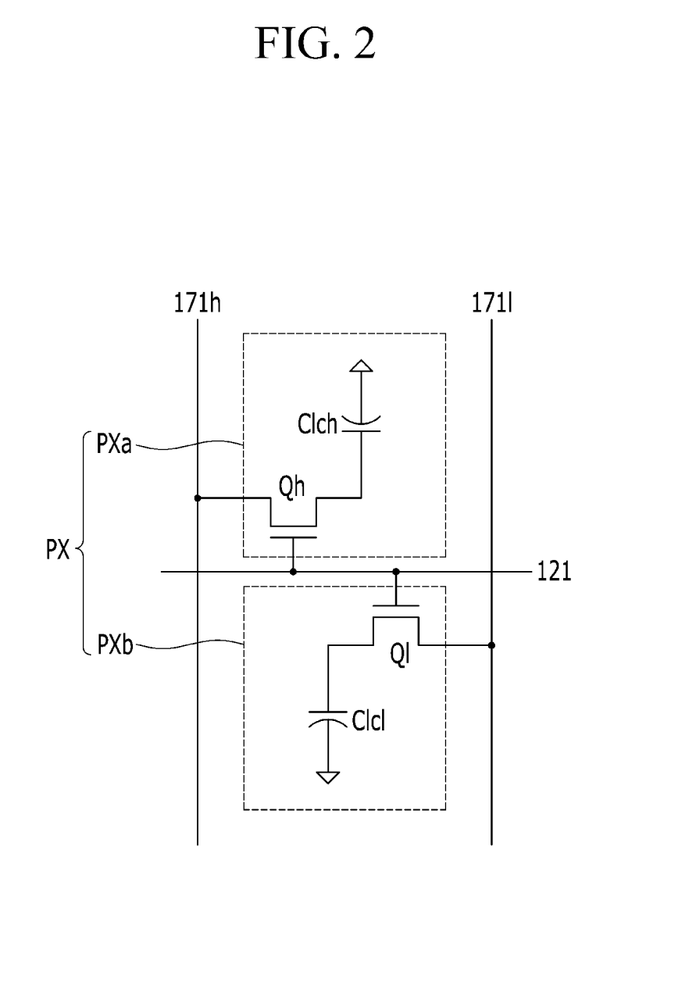
FIG. 2 is a plan view showing an exemplary embodiment of a pixel of a display device according to the invention.

Referring to FIG. 2, an exemplary embodiment of a display device according to the invention includes a plurality of signal lines 121, 171 and a pixel PX connected thereto. Although not shown, within the display device, a plurality of pixels PX is disposed in a matrix form including a plurality of pixel rows and a plurality of pixel columns.

Each pixel PX may include a first sub-pixel PXa and a second sub-pixel PXb. The first sub-pixel PXa and the second sub-pixel PXb may be vertically disposed the plan view, such as in a pixel column direction. Where the first sub-pixel PXa and the second sub-pixel PXb are disposed adjacent to each other in the pixel column direction, the first valley V1 may be elongated between the first sub-pixel PXa and the second sub-pixel PXb along a pixel row direction and a second valley V2 may be positioned between adjacent pixel columns.

The signal lines 121, 171 includes a gate line 121 transferring a gate signal, a first data line 171h transferring different data voltages, and a second data line 171l.

A first thin film transistor Qh is connected to the gate line 121 and the first data line 171h. A second thin film transistor Ql is connected to the same gate line 121 to which the first thin film transistor Qh is connected and the second data line 171l.

A first liquid crystal capacitor Clch connected to the first thin film transistor Qh is disposed in the first sub-pixel PXa and a second liquid crystal capacitor Clcl connected to the second thin film transistor Ql is disposed in the second sub-pixel PXb.

A first terminal of the first thin film transistor Qh is connected to the gate line 121, a second terminal is connected to the first data line 171h, and a third terminal is connected to the first liquid crystal capacitor Clch.

A first terminal of the second thin film transistor Ql is connected to the gate line 121, a second terminal is connected to the second data line 171l, and a third terminal is connected to the second liquid crystal capacitor Clcl.

An operation of the display device will be described. When a gate-on voltage is applied to the gate line 121, the first thin film transistor Qh and the second thin film transistor Ql connected to the gate line 121 are turned on and the first and second liquid crystal capacitors Clch and Clcl are charged by the different data voltages transferred through the first and second data lines 171h and 171l.

The data voltage transferred by the second data line 171l is lower than the data voltage transferred by the first data line 171h. Therefore, the second liquid crystal capacitor Clcl is charged with a voltage lower than that of the first liquid crystal capacitor Clch, thereby making it possible to improve visibility of the display device.

Hereinafter, a structure of one pixel of a display device according to an exemplary embodiment will be described with reference to FIGS. 3 to 5.

Figure 3:
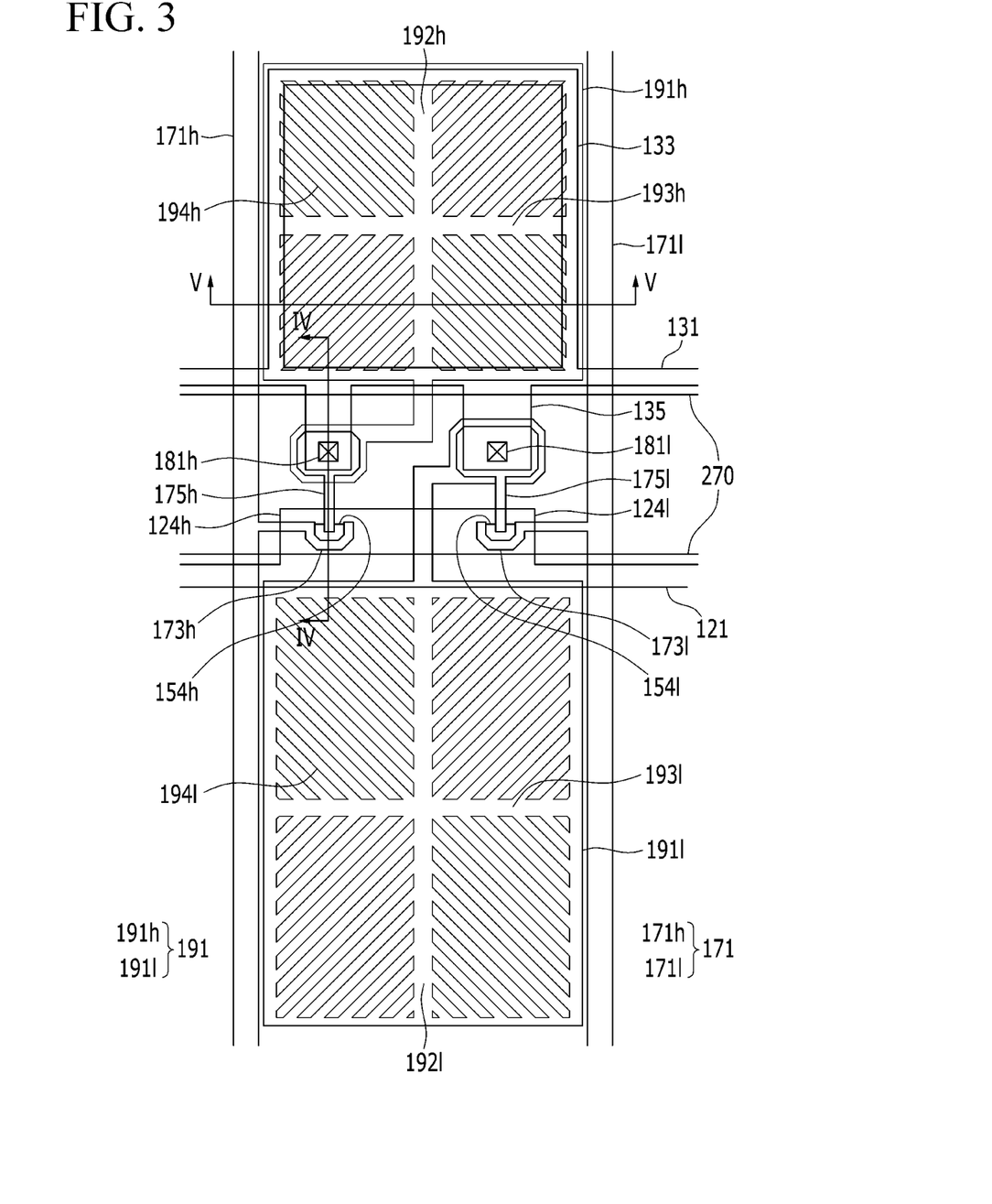
FIG. 3 is a plan view of an exemplary embodiment of a portion of a display device according to the invention.
Figure 4:
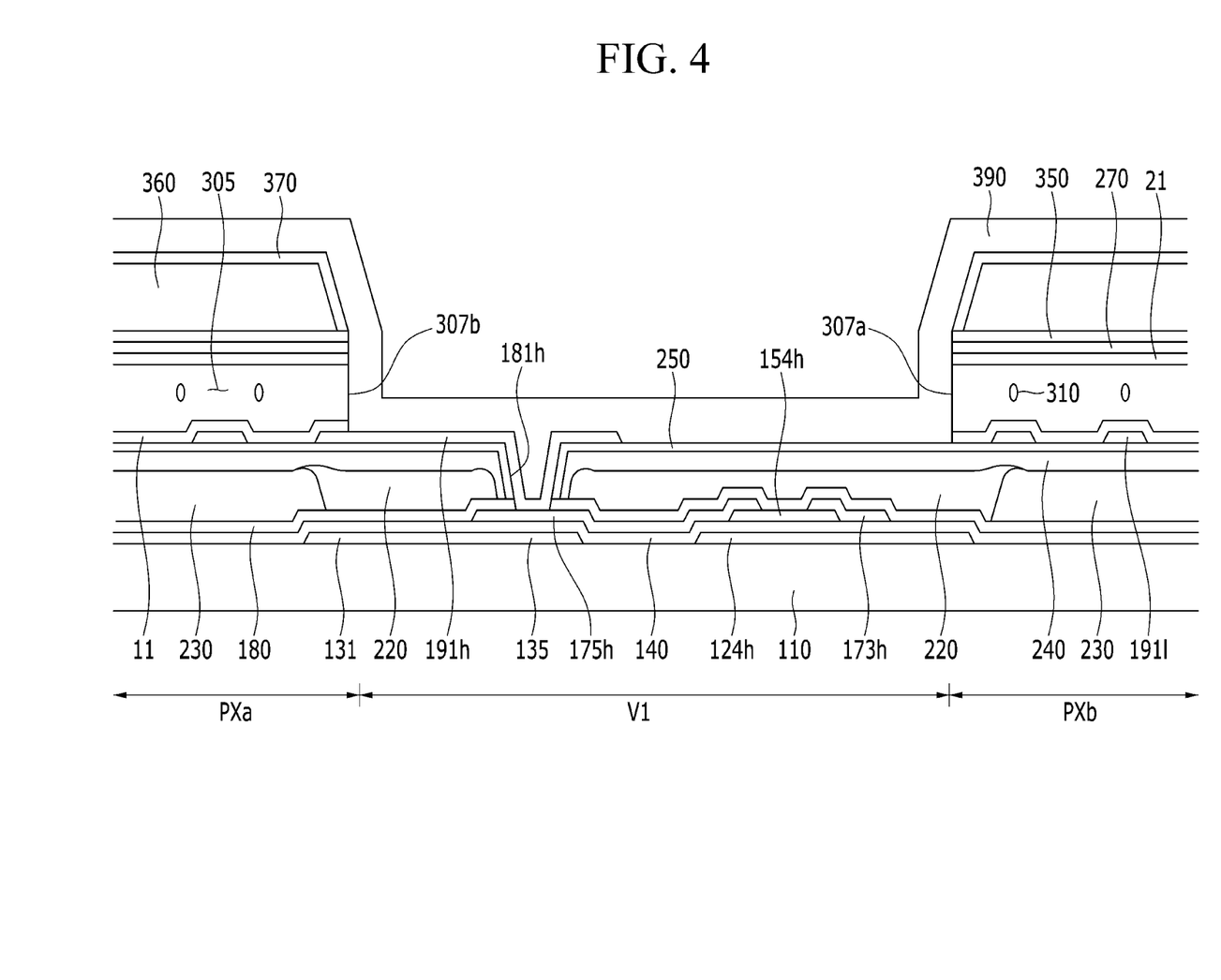
FIG. 4 is a cross-sectional view taken along line IV-IV of FIG. 3.
Figure 5:
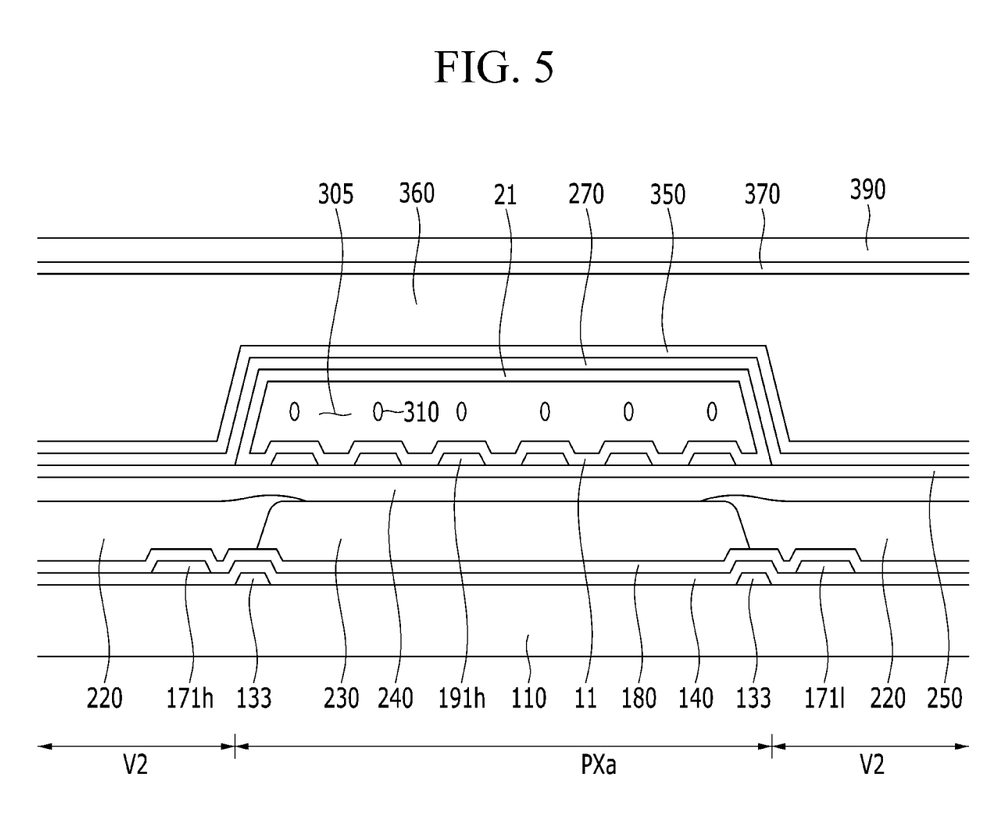
FIG. 5 is a cross-sectional view taken along line V-V of FIG. 3.

FIG. 3 is a plan view of an exemplary embodiment of a portion of a display device according to the invention, FIG. 4 is a cross-sectional view taken along line IV-IV of FIG. 3, and FIG. 5 is a cross-sectional view taken along line V-V of FIG. 3.

Referring to FIGS. 3 to 5, the gate line 121, and a first gate electrode 124h and a second gate electrode 124l that protrude from a main portion of the gate line 121, are each disposed on the substrate 110.

The gate line 121 is elongated to extend in a first direction and transfers a gate signal. The gate line 121 is positioned between two microcavities 305 which are adjacent to each other in a column direction. That is, the gate line 121 is positioned in the first valley V1.

The first gate electrode 124h and the second gate electrode 124l protrude from the main portion of the gate line 121 to an upper side of the gate line 121 in the plan view. The first gate electrode 124h and the second gate electrode 124l are connected to each other, so as to form one single unitary protrusion part. However, the invention is not limited thereto and the protruded shape of the first gate electrode 124h and the second gate electrode 124l may be variously changed.

A sustain electrode line 131, and sustain electrodes 133 and 135 that protrude from a main portion of the sustain electrode line 131, may be further formed on the substrate 110.

The sustain electrode line 131 is elongated to extend in a direction which is parallel to the gate line 121 and is disposed so as to be spaced apart from the gate line 121 in the plan view. A predetermined voltage may be applied to the sustain electrode line 131. The sustain electrode 133 protruding from the main portion of to an upper side of the sustain electrode line 131 is disposed so as to surround an edge of the first sub-pixel PXa. The sustain electrode 135 protruding from the main portion of to an upper side of the sustain electrode line 131 is disposed so as to be adjacent to the first gate electrode 124h and the second gate electrode 124l.

A gate insulating layer 140 is disposed on the gate line 121, the first gate electrode 124h, the second gate electrode 124l, the sustain electrode line 131, and the sustain electrodes 133 and 135. The gate insulating layer 140 may include an inorganic insulating material such as silicon nitride (SiNx), silicon oxide (SiOx), or the like. In addition, the gate insulating layer 140 may be defined by a single layer or multiple layers.

A first semiconductor 154h and a second semiconductor 154l are disposed on the gate insulating layer 140. The first semiconductor 154h may be positioned on (e.g., above) the first gate electrode 124h and the second semiconductor 154l may be positioned on (e.g., above) the second gate electrode 124l.

The first semiconductor 154h may also be positioned below the first data line 171h and the second semiconductor 154l may also be positioned below the second data line 171l. The first semiconductor 154h and the second semiconductor 154l may include an amorphous silicon, a polycrystalline silicon, a metal oxide, or the like.

Ohmic contact members (not shown) may be further disposed on the first semiconductor 154h and the second semiconductor 154l, respectively. The ohmic contact members may include silicide or a material such as n+ hydrogenated amorphous silicon which is doped with n-type impurities at a relatively high concentration.

The first data line 171h, the second data line 171l, a first source electrode 173h, a first drain electrode 175h, a second source electrode 173l and a second drain electrode 175l are disposed on the first semiconductor 154h, the second semiconductor 154l and the gate insulating layer 140, respectively.

The first data line 171h and the second data line 171l transfer a data signal and are elongated to extend in a second direction which intersects an elongation direction of the gate line 121 and the sustain electrode line 131. The data line 171 is positioned between two microcavities 305 which are adjacent to each other in a row direction. That is, the data line 171 is positioned in the second valley V2.

The first data line 171h and the second data line 171l transfer different data voltages from each other. The data voltage transferred by the second data line 171l is lower than the data voltage transferred by the first data line 171h.

The first source electrode 173h is disposed so as to protrude from a main portion of the first data line 171h toward the first gate electrode 124h and the second source electrode 173l is disposed so as to protrude from a main portion of the second data line 171l toward the second gate electrode 124l. The first drain electrode 175h and the second drain electrode 175l each include a relatively wide end portion at a first end thereof and a rod shape elongated portion at a second end thereof opposite to the first end.

The relatively wide first end portions of the first drain electrode 175h and the second drain electrode 175l are overlapped with the sustain electrode 135 that protrudes downward from the main portion of the sustain electrode line 131. The second end portions having the rod shape of the first drain electrode 175h and the second drain electrode 175l are partially surrounded by the first source electrode 173h and the second source electrode 173l, respectively, in the plan view.

The first and second gate electrodes 124l and 124l, the first and second source electrodes 173h and 173l, and the first and second drain electrodes 175h and 175l form the first and second thin film transistors ("TFT") Qh and Ql, together with the first and second semiconductors 154h and 154l, respectively. Channels of the thin film transistors are defined at an exposed portion of the respective semiconductors 154h and 154l disposed between the respective source electrode 173h and 173l and the respective drain electrodes 175h and 175l.

The passivation layer 180 is disposed on the first data line 171h, the second data line 171l, the first source electrode 173h, the first drain electrode 175h, the portion of the first semiconductor 154h exposed between the first source electrode 173h and the first drain electrode 175h, the second source electrode 173l, the second drain electrode 175l, and the portion of the second semiconductor 154l exposed between the source electrode 173l and the second drain electrode 175l.

The passivation layer 180 may include an organic insulating material or an inorganic insulating material, and may be formed of a single layer or multiple layers.

A color filter 230 is disposed on the passivation layer 180 in each pixel PX among a plurality of pixels PX.

An individual color filter 230 may display one of primary colors such as the three primary colors of red, green and blue. The colors that the color filter 230 may display are not limited to the three primary colors such as red, green and blue. In an exemplary embodiment, for example, an individual color filer 230 may also display colors such as cyan, magenta, yellow and white. The color filter 230 may not be disposed in the first valley V1.

A region between neighboring color filters 230 is provided with the light blocking member 220. The light blocking member 220 may be disposed at a boundary area between adjacent pixels PX and/or sub-pixels PXa and PXb, and on the thin film transistors Qh and Ql, so as to reduce or effectively prevent light leakage. That is, the light blocking member 220 may be disposed in the first valley V1 and the second valley V2. The color filter 230 and the light blocking member 220 may be overlapped with each other in some regions.

The first insulating layer 240 may be further disposed on the color filter 230 and the light blocking member 220. The first insulating layer 240 may include an organic insulating material and serve to planarize the color filters 230.

A second insulating layer 250 may be further disposed on the first insulating layer 240. The second insulating layer 250 may include an inorganic insulating material and serve to protect the color filters 230 and the first insulating layer 240.

In the passivation layer 180, the first insulating layer 240, and the second insulating layer 250, a first contact hole 185l is defined that exposes the relatively wide end portion of the first drain electrode 175h, and a second contact hole 181l is defined that exposes the relatively wide end portion of the second drain electrode 175l.

A pixel electrode 191 is disposed on the second insulating layer 250. The pixel electrode 191 may include a transparent metal material such as indium-tin-oxide ("ITO"), indium-zinc-oxide ("IZO"), or the like.

The pixel electrode 191 collectively includes a first sub-pixel electrode 191h and a second sub-pixel electrode 191l that are separated from each other while having the gate line 121 and the sustain electrode line 131 therebetween.

The first sub-pixel electrode 191h and the second sub-pixel electrode 191l are disposed in an upper region and a lower region of the pixel PX with respect to the gate line 121 and the sustain electrode line 131 therebetween. That is, the first sub-pixel electrode 191h and the second sub-pixel electrode 191l are separated from each other while having the first valley V1 elongated therebetween, the first sub-pixel electrode 191h is positioned in the first sub-pixel PXa, and the second sub-pixel electrode 191l is positioned in the second sub-pixel PXb.

The first sub-pixel electrode 191h is connected to the first drain electrode 175h through the first contact hole 181h, and the second sub-pixel electrode 191l is connected to the second drain electrode 175l through the second contact hole 181l. Therefore, when the first thin film transistor Qh and the second thin film transistor Ql are in an ON state, the first sub-pixel electrode 191h and the second sub-pixel electrode 191l are applied with different data voltages from the first drain electrode 175h and the second drain electrode 175l. An electric field may be formed between the pixel electrode 191 and a common electrode 270.

An overall shape of each of the first sub-pixel electrode 191h and the second sub-pixel electrode 191l is a quadrangular shape. Each of the first sub-pixel electrode 191h and the second sub-pixel electrode 191l includes a cross stem part including horizontal stem parts 193h and 193l, and vertical stem parts 192h and 192l intersecting with the horizontal stem parts 193h and 193l. In addition, the first sub-pixel electrode 191h and the second sub-pixel electrode 191l each include a plurality of fine branch parts 194h and 194l.

The pixel electrode 191 is divided into four sub-regions by the horizontal stem parts 193h and 193l and the vertical stem parts 192h and 192l. The fine branch parts 194h and 194l are obliquely elongated to extend from the horizontal stem parts 193h and 193l and the vertical stem parts 192h and 192l, and an extension direction thereof may form an angle of approximately 45° or 135° with the gate line 121 or the horizontal stem parts 193h and 193l. Extension directions of fine branch parts 194h and 194l of two neighboring sub-regions may be perpendicular to each other.

According to the illustrated exemplary embodiment, the first sub-pixel electrode 191h and the second sub-pixel electrode 191l may each further include an outer stem part surrounding outer portions of the first sub-pixel PXa and the second sub-pixel PXb, respectively.

The layout of the pixel, the structure of the thin film transistor, and the shape of the pixel electrode as described above are merely an example, the invention is not limited thereto and may be variously modified.

The common electrode 270 is disposed on the pixel electrode 191 so as to be spaced apart from the pixel electrode 191 by a predetermined distance in a cross-sectional direction. The microcavity 305 is disposed between the pixel electrode 191 and the common electrode 270.

That is, the microcavity 305 is surrounded by the pixel electrode 191 and the common electrode 270 at lower and upper sides thereof. The common electrode 270 is elongated in a row direction, is disposed on the microcavity 305 and is extended from being on the microcavity to be disposed within the second valley V2. The common electrode 270 is extended so as to cover an upper surface and sides of the microcavity 305. In the plan view, the microcavity 305 may have a width and an area that are varied depending on a size and resolution of the display device.

In each pixel PX, the common electrode 270 is disposed so as to be spaced apart from the substrate 110, thereby accommodating the microcavity 305 thereunder, but in the second valley V2, the common electrode 270 is disposed so as to extend toward the substrate 110 such that the microcavity 305 is not accommodated thereunder. In the second valley V2, the common electrode 270 is disposed on the second insulating layer 250, such as directly on the second insulating layer 250, but the invention is not limited thereto.

The common electrode 270 may include a transparent metal material such as ITO, IZO, or the like. The common electrode 270 may be applied with a predetermined voltage, and an electric field may be formed between the pixel electrode 191 and the common electrode 270.

A first alignment layer 11 is disposed on the pixel electrode 191. The first alignment layer 11 may also be disposed on the second insulating layer 250, such as directly on the second insulating layer 250, at portions of the second insulating layer 250 which are not covered by the pixel electrode 191.

A second alignment layer 21 is disposed below the common electrode 270 so as to face the first alignment layer 11 across the microcavity 305.

The first alignment layer 11 and the second alignment layer 21 may be a vertical alignment layer and may include an alignment material such as polyamic acid, polysiloxane, polyimide ("PI"), or the like. The first and second alignment layers 11 and 21 may be connected to each other at a side wall of an edge of the microcavity 305 to collectively form a single continuous alignment layer member.

A liquid crystal layer including liquid crystal molecules 310 is disposed in the microcavity 305 positioned between the pixel electrode 191 and the common electrode 270. The liquid crystal molecules 310 may have negative dielectric constant anisotropy and may be elongated in a direction which is perpendicular to the substrate 110 in a state in which an electric field is not applied thereto. That is, a vertical alignment may be implemented.

The first sub-pixel electrode 191h and the second sub-pixel electrode 191l to which the data voltage is applied generate the electric field together with the common electrode 270, so as to determine a direction of the liquid crystal molecule 310 positioned in the microcavity 305 between the two electrodes 191 and 270. Luminance of light passing through the liquid crystal layer is changed depending on the direction of the liquid crystal molecule 310 determined as described above.

A third insulating layer 350 is further disposed on the common electrode 270. Since the third insulating layer 350 is disposed on the common electrode 270 and the edge of the common electrode 270 has a step shape, an edge of the third insulating layer 350 may also have the step shape. The third insulating layer 350 has a portion which is adjacent to the second valley V2 and is extended to have the step shape.

The third insulating layer 350 may include an inorganic insulating material such as silicon nitride (SiNx), silicon oxide (SiOx), or the like, and may be omitted, if necessary.

The roof layer 360 is formed on the third insulating layer 350. The roof layer 360 may include an organic material. Since the roof layer 360 is disposed to be relatively thick using the organic material, the roof layer 260 formed from the relatively thick organic mater is formed to be flat even on a portion in which the common electrode 270 and the third insulating layer 350 has the step shape.

The roof layer 360 is elongated in a row direction and is disposed across the microcavity 305 and in the second valley V2 in the row direction. The roof layer 360 is extended so as to cover an upper surface and sides of the microcavity 305. In an exemplary embodiment of a method of manufacturing a display device, a roof layer material for forming the roof layer 360 may be hardened such as by a curing process such that a shape of the microcavity 305 defined by a profile of the formed roof layer 360 is maintained. The roof layer 360 is disposed so as to be spaced apart from the pixel electrode 191 while having the microcavity 305 defined therebetween.

The common electrode 270 and the roof layer 360 are disposed to terminate at the first valley V1 and expose a side of the edge of the microcavity 305. Since the common electrode 270 and the roof layer 360 are disposed to terminate at the first valley V1, portions of the microcavity 305 which are not covered by the common electrode 270 and the roof layer 360 are referred to as the injection holes 307a and 307b.

The injection holes 307a and 307b include a first injection hole 307a that exposes a side of a first edge of the microcavity 305 and a second injection hole 307b that exposes a side of a second edge of the microcavity 305. By exposing the sides of the microcavity 305, an inner area thereof is exposed outside the microcavity 305. The first edge and the second edge of a same microcavity 305 are edges facing or opposite to each other. In an exemplary embodiment, for example, in the column direction taken in the plan view, the first edge may be an upper edge of the microcavity 305 and the second edge may be a lower edge of the microcavity 305. The injection holes 307a and 307b respectively expose the sides of the first and second edges of the microcavity 350 which are adjacent to the first valley V1.

Since the inner area of the microcavity 305 is exposed by the injection holes 307a and 307b, an alignment layer material such as in a liquid form, a liquid crystal material, or the like may be injected into the microcavity 305 through the injection holes 307a and/or 307b.

A fourth insulating layer 370 may be further disposed on the roof layer 360. The fourth insulating layer 370 may include an inorganic insulating material such as silicon nitride (SiNx), silicon oxide (SiOx), or the like. The fourth insulating layer 370 may be disposed to cover the top surface and the sides of the roof layer 360. The fourth insulating layer 370 may also terminate at the first valley V1 to expose a side of the edge of the microcavity 305 at the first valley V1. The fourth insulating layer 370 serves to protect the roof layer 360 including an organic material and may be omitted in an exemplary embodiment.

An overcoat 390 is disposed on the fourth insulating layer 370. The overcoat 390 is extended from being on the microcavity 305 so as to cover the injection holes 307a and 307b that expose a portion of the microcavity 307 to outside the microcavity 305. That is, the overcoat 390 may seal the microcavity 305 so that the liquid crystal molecule 310 disposed in the microcavity 305 is maintained within the microcavity 305 and not leaked outside the microcavity 305.

The overcoat 390 may include a multilayer structure such as a bi-layer or a triple-layer structure. The bi-layer includes two layers including different materials. The triple-layer includes three layers, where the layers adjacent to each other include different materials. In an exemplary embodiment, for example, the overcoat 390 may include a layer of an organic insulating material and a layer of an inorganic insulating material adjacent to each other.

Although not shown, polarizing plates may be further disposed on upper and lower surfaces of the display device. The polarizing plates may include a first polarizing plate and a second polarizing plate. Among layers of the display device, the first polarizing plate may be attached at the lower surface of the substrate 110 of the display device and the second polarizing plate may be attached at the cover layer 390 of the display device.

In addition, a structure of a display region and a peripheral region of the display device will be described with reference to FIG. 1. Here, the display region of the display device, which is a region displaying an image, is a region in which the pixel PX described with reference to FIGS. 3 to 5 is disposed. In addition, the peripheral region of the display device indicates remaining regions except for the display region.

Referring to FIG. 1, pad parts 410 and 420 connected to the gate line and the data line, respectively, are disposed in the peripheral region. The respective pad parts are connected to the gate line and the data line of the pixel of the display region so as to transfer a gate voltage and a data voltage, respectively.

The gate pad 410 is connected to the gate line of the pixel PX disposed in the display region. The data pad 420 is connected to the data line of the pixel PX disposed in the display region.

A common voltage line 172 which applies a voltage to the common electrode 270 is disposed in the peripheral region. A plurality of exposure holes 221 and 241 are defined to expose the common voltage line 172, and the common voltage line 172 and the common electrode 270 are in contact with each other via the exposure holes 221 and 241.

The common voltage line 172 is connected to a common voltage supplying means (not shown) so as to be supplied with the common voltage. The common voltage supplied to the common voltage line 172 is applied to the common electrode 270 by the common voltage line 172 and the common electrode 270 in contact with each other via the exposure holes 221 and 241, and the common voltage is transferred to the common electrode 270 of each pixel PX disposed in the display region.

Hereinafter, an exemplary embodiment of a structure of the peripheral region of the display device according to the invention will be described with reference to FIG. 6.

A first peripheral insulating layer 140a is disposed on the substrate 110. The first peripheral insulating layer 140a may correspond to the gate insulating layer 140 shown in FIG. 4. That is, in an exemplary embodiment of manufacturing a display device, when the gate insulating layer 140 is formed in the display region, the first peripheral insulating layer 140a of FIG. 6 may be simultaneously formed in the peripheral region. The gate insulating layer 140 of the display region is in a same layer as the first peripheral insulating layer 140a in the peripheral region, among layers of the display device disposed on the substrate 110.

The first peripheral insulating layer 140a may include an inorganic insulating material such as silicon nitride (SiNx), silicon oxide (SiOx), or the like. In addition, the first peripheral insulating layer 140a may include a single layer or multiple layers.

A first peripheral wire 300 may be disposed on the first peripheral insulating layer 140a. The first peripheral wire 300 indicated in FIG. 6 may represent or correspond to the common voltage line 172 shown in FIG. 1. The first peripheral wire 300 in the peripheral region may apply the voltage to the common electrode 270 in the display region through the exposure holes as described above.

A peripheral passivation layer 180a is positioned on the first peripheral insulating layer 140a. The peripheral passivation layer 180a covers the first peripheral wire 300. However, an opening defined in the peripheral passivation layer 180a exposes a portion of the first peripheral wire 300. The peripheral passivation layer 180a may expose the portion of the first peripheral wire 300, so as to allow the common electrode 270 of the display region and the first peripheral wire 300 of the peripheral region to be in contact with each other.

The first peripheral passivation layer 180a may correspond to the passivation layer 180 shown in FIG. 4. That is, in an exemplary embodiment of manufacturing a display device, when the passivation layer 180 is formed in the display region, the peripheral passivation layer 180a of FIG. 6 may be simultaneously formed in the peripheral region. The passivation layer 180 of the display region is in a same layer as the peripheral passivation layer 180a in the peripheral region, among layers of the display device disposed on the substrate 110.

The peripheral passivation layer 180a may include an organic insulating material or an inorganic insulating material, and may include a single layer or multiple layers.

A light blocking member 220a is positioned on the peripheral passivation layer 180a. The light blocking member 220a indicated in FIG. 6 may correspond to the light blocking member 220 of FIG. 4. That is, in an exemplary embodiment of manufacturing a display device, when the light blocking member 220 is formed in the display region, the light blocking member 220a of FIG. 6 may be simultaneously formed in the peripheral region. The light blocking member 220 of the display region is in a same layer as the light blocking member 220a in the peripheral region, among layers of the display device disposed on the substrate 110.

A first exposure hole 221 is defined in the light blocking member 220a and exposes a portion of the first peripheral wire 300 positioned therebelow.

According to an exemplary embodiment, a second peripheral insulating layer 240a is positioned on the light blocking member 220a.

A second exposure hole 241 is defined in the second peripheral insulating layer 240a and exposes a portion of the first peripheral wire 300. More specifically, the same portion of the first peripheral wire 300 may be exposed by both the first exposure hole 221 defined in the light blocking member 220a and the second exposure hole 241 defined in the second peripheral insulating layer 240a.

According to an exemplary embodiment, the second peripheral insulating layer 240a exposes a portion of an upper surface of the light blocking member 220a which is adjacent to the first exposure hole 221.

Figure 6:
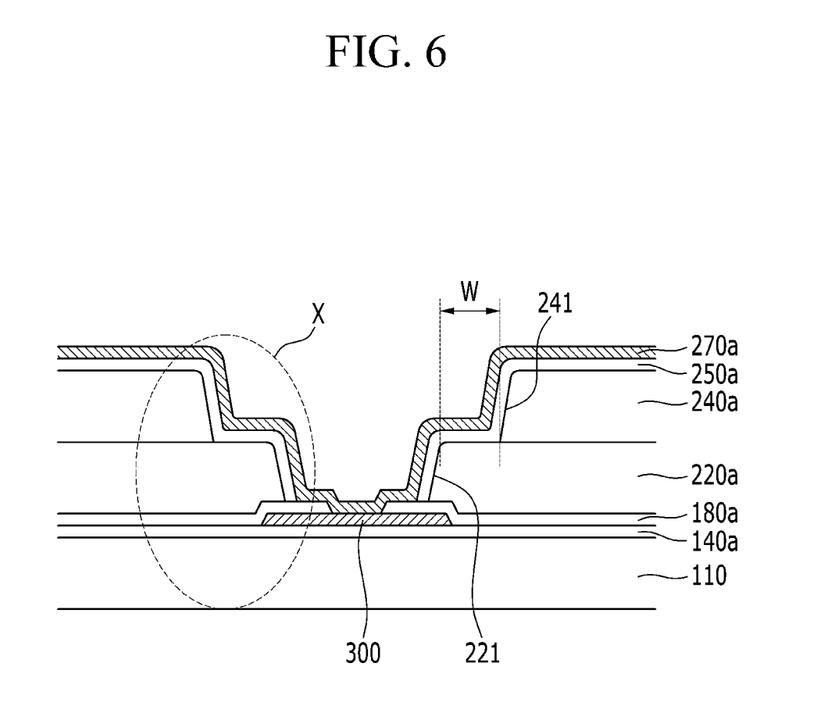
FIG. 6 is a cross-sectional view taken along line VI-VI of FIG. 1.

Specifically, the first exposure hole 221 is positioned in the second exposure hole 241 in the plan view of FIG. 6. That is, the second exposure hole 241 has a planar size larger than that of the first exposure hole 221. Thereby, the portion of the upper surface of the light blocking member 220a which is adjacent to the first exposure hole 221 may be exposed.

The upper surface of the light blocking member 220a exposed by the second peripheral insulating layer 240a may have a width W of about 10 micrometers (μm) to about 20 μm. In an exemplary embodiment, the width W of the exposed light blocking member 220a may be about 15 μm.

The second peripheral insulating layer 240a may include an organic insulating material and serve to planarize the light blocking member 220a, or the like.

According to an exemplary embodiment, since the light blocking member 220a and the second peripheral insulating layer 240a are extended to be disposed in the above-mentioned shape, even when the sacrificial layer 700 temporarily formed on the second peripheral insulating layer 240a during a process of manufacturing the display device is removed, the sacrificial layer 700 does not remain on the peripheral passivation layer 180a or the side of the light blocking member 220a.

Figure 7:
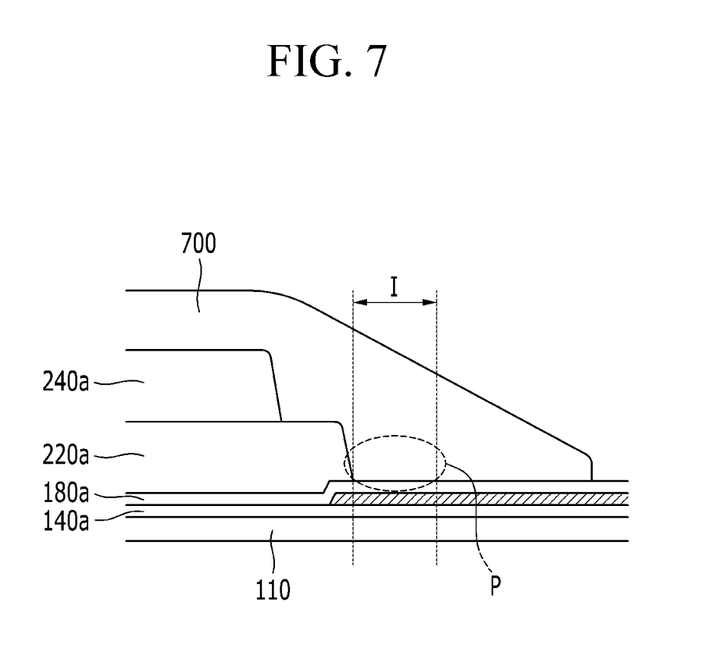
FIG. 7 is an enlarged cross-sectional view of region X of FIG. 6.
Figure 8:
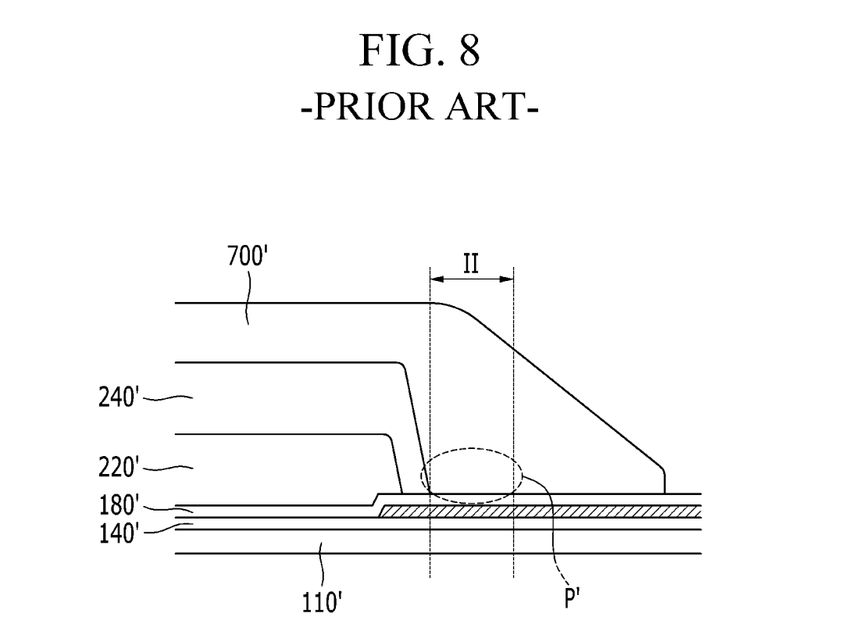
FIG. 8 is an enlarged cross-sectional view of a peripheral region according to the related art.

FIG. 7 is an enlarged cross-sectional view of region X of FIG. 6, and FIG. 8 is an enlarged cross-sectional view of a peripheral region of the related art corresponding to the region X of FIG. 6.

Although not shown in FIG. 7 and FIG. 8, referring to the above-described method, an opening defined in the peripheral passivation layer 180a and exposing a portion of the first peripheral wire 300 may be formed before the sacrificial layer 700 is formed on the second peripheral insulating layer 240a, but the invention is not limited thereto. Alternatively, the sacrificial layer 700 may be formed on the peripheral passivation layer 180a with no opening defined therein and exposed by the light blocking member 220a and the second peripheral insulating layer 240a. Here, the opening defined in the peripheral passivation layer 180a and exposing a portion of the first peripheral wire 300 may be formed after the sacrificial layer 700 is removed. As such, remaining of the sacrificial layer 700 in the peripheral region after removing the sacrificial layer 700 is undesirable.

More specifically, referring to FIG. 7, after the second peripheral insulating layer 240a described above is formed, the sacrificial layer 700 may be formed on the second peripheral insulating layer 240a.

Here, the sacrificial layer 700 is used to form the microcavity 305 between the substrate 110 and the roof layer 360 in the display region in which the liquid crystal is filled. In an exemplary embodiment of a method of manufacturing a display device, the display device is manufactured by forming the sacrificial layer including an organic material, or the like on the substrate, forming the roof layer on the sacrificial layer and then removing the sacrificial layer to form a microcavity, and filling the liquid crystal into the microcavity formed by the removal of the sacrificial layer.

The sacrificial layer 700 used for the above-mentioned process is also formed on the second peripheral insulating layer 240a in the peripheral region. Thereafter, during a process of forming a pattern of the sacrificial layer 700, the sacrificial layer 700 positioned in the peripheral region may be removed.

Referring to FIG. 8, according to a structure of a peripheral region of a display device according to the related art, while a sacrificial layer 700' is removed, a portion of the sacrificial layer 700' remains on an upper portion of a peripheral passivation layer 180' or a side (P' region of FIG. 8) of a second peripheral insulating layer 240'.

As such, when the sacrificial layer 700' remains on the upper portion of the peripheral passivation layer 180' or the side (P' region of FIG. 8) of the second peripheral insulating layer 240', a third peripheral insulating layer 250a and a second peripheral wire 270a subsequently formed on the substrate 110' may be undesirably lifted.

According to an exemplary embodiment, as shown in FIG. 7, even when the sacrificial layer 700 is removed, the sacrificial layer 700 does not remain on the peripheral passivation layer 180a or the side (P region of FIG. 7) of the light blocking member 220a, due to the shape of the light blocking member 220a and the second peripheral insulating layer 240a.

A region I of FIG. 7 and a region II of FIG. 8 will be described in more detail. The sacrificial layer 700' of the region II of FIG. 8 is stacked to be relatively thicker than the sacrificial layer 700 of the region I of FIG. 7. The above-mentioned phenomenon occurs due to the shape of the light blocking member 220a and the second peripheral insulating layer 240a of FIG. 7.

Therefore, according to an exemplary embodiment of the invention, since the sacrificial layer 700 in the region I of FIG. 7 is stacked to be relatively thin, the sacrificial layer 700 does not remain on an upper portion of a peripheral passivation layer 180a or a side (P region of FIG. 7) of a second peripheral insulating layer 240a and may entirely be removed therefrom.

Referring to again FIG. 6, a third peripheral insulating layer 250a is positioned on the second peripheral insulating layer 240a. The third peripheral insulating layer 250a covers sides of the light blocking member 220a and of the second peripheral insulating layer 240a. The third peripheral insulating layer 250a may correspond to the second insulating layer 250 shown in FIG. 4. That is, in an exemplary embodiment of manufacturing a display device, when the second insulating layer 250 is formed in the display region, the second insulating layer 250a of FIG. 6 may be simultaneously formed in the peripheral region. The second insulating layer 250 of the display region is in a same layer as the second insulating layer 250a in the peripheral region, among layers of the display device disposed on the substrate 110.

The third peripheral insulating layer 250a covers the side of the light blocking member 220a exposed by the first exposure hole 221 and the side of the second peripheral insulating layer 240a exposed by the second exposure hole 241.

In addition, a second peripheral wire 270a is positioned on the third peripheral insulating layer 250a. The second peripheral wire 270a is in contact with the first peripheral wire 300. The second peripheral wire 270a in the peripheral region is connected to the common electrode 270 of the display region. That is, as described above, since the first peripheral wire 300 representing the common voltage line 172 in FIG. 1 is in contact with the second peripheral wire 270a connected to the common electrode 270 of the display region, the voltage supplied through the common voltage line 172 may be applied to the common electrode 270.

The second peripheral wire 270a may include a transparent metal material such as ITO, IZO, or the like.

Hereinafter, an exemplary embodiment of a manufacturing method of a display device according to the invention as described above will be described. In describing the exemplary embodiment of the manufacturing method of the display device according to the invention, a detailed description of the same component as that of the display device described above will be omitted.

A substrate 110 including a display region displaying an image and a peripheral region as a remaining region excluding the display region is prepared.

A first peripheral insulating layer 140a is formed on the substrate 110. As described above, the first peripheral insulating layer 140a may be formed at the same time when a gate insulating layer 140 of the display region is formed.

In addition, in the peripheral region of the substrate 110, a first peripheral wire 300 is formed on the first peripheral insulating layer 140a. The first peripheral wire 300 may correspond to the common voltage line 172 shown in FIG. 1. The first peripheral wire 300 may apply the voltage to the common electrode 270 through the exposure holes as described above.

A peripheral passivation layer 180a is stacked on the first peripheral insulating layer 140a. A hole exposing a portion of the first peripheral wire 300 is defined in the peripheral passivation layer 180a.

Then, a light blocking member 220a in which a first exposure hole 221 exposing the portion of the first peripheral wire 300 is defined is formed on the peripheral passivation layer 180a.

A second peripheral insulating layer 240a in which a second exposure hole 241 is defined is formed on the light blocking member 220a. The second exposure hole 241 exposes a portion of the first peripheral wire 300 formed therebelow.

The same portion of the first peripheral wire 300 may be exposed by both the first exposure hole 221 formed in the light blocking member 220a and the second exposure hole 241 formed in the second peripheral insulating layer 240a.

In an exemplary embodiment according to the invention, the second peripheral insulating layer 240a exposes a portion of an upper surface of the light blocking member 220a which is adjacent to the first exposure hole 221.

As described above, specifically, the first exposure hole 221 is positioned in the second exposure hole 241 in the plan view of FIG. 6. That is, the second exposure hole 241 has a planar size larger than that of the first exposure hole 221. Thereby, the portion of the upper surface of the light blocking member 220a which is adjacent to the first exposure hole 221 may be exposed.

The upper surface of the light blocking member 220a exposed by the second peripheral insulating layer 240a may have a width W of about 10 μm to about 20 μm. In an exemplary embodiment, the width W of the exposed light blocking member 200a may be about 15 μm.

A sacrificial layer 700 is formed on the peripheral insulating layer 240a, as shown in FIG. 7. Then, the sacrificial layer 700 is removed from the peripheral insulating layer 240a.

During a process of forming a pattern of the sacrificial layer formed in the display region, the sacrificial layer 700 positioned in the peripheral region may be removed.

As described above, referring to FIG. 8, according to a structure of a peripheral region of a display device according to the related art, when a sacrificial layer 700' is removed, a portion of the sacrificial layer 700' remains on an upper portion of a peripheral passivation layer 180' or a side (P' region of FIG. 8) of a second peripheral insulating layer 240'.

As such, when the sacrificial layer 700' remains on the upper portion of the peripheral passivation layer 180' or the side (P' region of FIG. 8) of the second peripheral insulating layer 240', a third peripheral insulating layer 250a and a second peripheral wire 270a subsequently formed on the substrate 110' may be undesirably lifted.

According to one or more exemplary embodiment described above, referring to FIG. 7, even when the sacrificial layer 700 in the peripheral region is removed during a process of forming a pattern of the sacrificial layer formed in the display region, the sacrificial layer 700 once formed in the peripheral region does not remain on the peripheral passivation layer 180a or the side (P region of FIG. 7) of the light blocking member 220a, owing to the shape and/or corresponding profiles defined by the light blocking member 220a and the second peripheral insulating layer 240a.

A region I of FIG. 7 and a region II of FIG. 8 will be described in more detail. The sacrificial layer 700' of the region II of FIG. 8 is stacked to be relatively thicker than the sacrificial layer 700 of the region I of FIG. 7. The above-mentioned phenomenon occurs due to the shape and/or profile of the light blocking member 220a and the second peripheral insulating layer 240a of FIG. 7.

Therefore, according to one or more exemplary embodiment described above, since the sacrificial layer 700 in the region I of FIG. 7 is stacked to be relatively thin as compared to that in FIG. 8, the sacrificial layer 700 does not remain during a process of forming a pattern of the sacrificial layer formed in the display region and may be entirely or completely removed such that no portion of the sacrificial layer 700 exists in the peripheral region of a finally manufactured display device.

Referring again to FIG. 6, for example, after the sacrificial layer 700 is removed during a process of forming a pattern of the sacrificial layer formed in the display region, a third peripheral insulating layer 250a is formed on the second peripheral insulating layer 240a so as to cover sides of the light blocking member 220a and the second peripheral insulating layer 240a at the first and second exposure holes 221 and 241 respectively.

Then, a second peripheral wire 270a is formed on the third peripheral insulating layer 250a. The second peripheral wire 270a is electrically in contact with the first peripheral wire 300 corresponding to the common voltage line 172 (refer to FIG. 1). As described above, the second peripheral wire 270a of the peripheral region is connected to the common electrode 270 of the display region. That is, since the first peripheral wire 300 corresponding to the common voltage line 172 is in contact with the second peripheral wire 270a, and since the second peripheral wire 270a of the peripheral region is connected to the common electrode 270, the voltage supplied through the common voltage line 172 in the peripheral region may be applied to the common electrode 270 in the display region of the display device.

According to one or more exemplary embodiment described above, since the light blocking member 220a and the second peripheral insulating layer 240 of the peripheral region are formed in the above-mentioned shape and/or profile, even when the sacrificial layer 700 temporarily formed on the second peripheral insulating layer 240a during the process of manufacturing the display device is removed, the sacrificial layer 700 does not remain on the peripheral passivation layer 180a or the side of the light blocking member 220a of the peripheral region.

In one or more exemplary embodiment of the display device and the manufacturing method of the same according to the invention, after the process of removing the sacrificial layer in the peripheral region is performed, no portion of the sacrificial layer in the peripheral region remains on the underlying insulating layers and may be completely removed, due to the shape of the underlying insulating layers in the peripheral region on which the sacrificial layer is stacked.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A display device comprising:
    a substrate including a display region which displays an image and a peripheral region positioned around the display region;
    the peripheral region of the substrate includes disposed therein:
        a first peripheral insulating layer on the substrate;
        a first peripheral wire on the first peripheral insulating layer;
        a peripheral passivation layer on the first peripheral insulating layer, the peripheral passivation layer exposing a portion of the first peripheral wire;
        a light blocking member on the peripheral passivation layer, in which is defined a first exposure hole which exposes the portion of the first peripheral wire exposed by the peripheral passivation layer;
        a second peripheral insulating layer on the light blocking member, in which is defined a second exposure hole which exposes the portion of the first peripheral wire exposed by the peripheral passivation layer and the light blocking member;

a third peripheral insulating layer on the second peripheral insulating layer, covering sides of the light blocking member and the second peripheral insulating layer exposed at the first and second exposure holes; and a second peripheral wire on the third peripheral insulating layer, in contact with the first peripheral wire, wherein the second peripheral insulating layer at the second exposure hole exposes an upper surface of the light blocking member adjacent to the first exposure hole.

2. The display device of claim 1, wherein:
in a plan view, the first exposure hole is positioned within the second exposure hole.

3. The display device of claim 1, wherein:
a width of the upper surface of the light blocking member exposed by the second peripheral insulating layer is about 10 micrometers to about 20 micrometers.

4. The display device of claim 1, wherein:
the first peripheral wire is a common voltage line.

5. The display device of claim 1, wherein:
the second peripheral wire is connected to a common electrode of the display region.

6. The display device of claim 1, wherein:
the second peripheral wire includes a transparent metal material.

7. The display device of claim 1, wherein:
the second peripheral wire includes an organic insulating material.

8. The display device of claim 1, wherein:
the second peripheral wire is electrically connected to the portion of the first peripheral wire exposed by each of the peripheral passivation layer, the light blocking member and the second peripheral insulating layer.

9. The display device of claim 1, wherein:
the display region of the substrate includes disposed therein:
  a thin film transistor on the substrate;
  a pixel electrode connected to the thin film transistor;
  a roof layer on the pixel electrode, spaced apart from the pixel electrode in a cross-sectional direction;
  a plurality of microcavities between the spaced apart roof layer and the pixel electrode;
  an injection hole exposing an inner area of the microcavities;
  a liquid crystal layer within the microcavities; and
  an overcoat on the roof layer, extending to cover the injection hole and seal the microcavities.

10. The display device of claim 1, wherein:
the second peripheral wire in contact with the first peripheral wire extends to contact sides and an upper surface of the peripheral passivation layer at which the portion of the first peripheral wire is exposed.

11. The display device of claim 1, wherein:
the third peripheral insulating layer on the second peripheral insulating layer extends to contact the sides of the light blocking member and the second peripheral insulating layer exposed at the first and second exposure holes.

12. A manufacturing method of a display device, the manufacturing method comprising:
preparing a substrate including a display region which displays an image and a peripheral region positioned around the display region; and
in the peripheral region of the substrate:
  forming a first peripheral insulating layer on the substrate;
  forming a first peripheral wire on the first peripheral insulating layer;
  forming a peripheral passivation layer on the first peripheral insulating layer, the peripheral passivation layer exposing a portion of the first peripheral wire;
  forming a light blocking member in which is defined a first exposure hole exposing the portion of the first peripheral wire exposed by the peripheral passivation layer, on the peripheral passivation layer;
  forming a second peripheral insulating layer in which is defined a second exposure hole exposing the portion of the first peripheral wire exposed by the peripheral passivation layer and the light blocking member, on the light blocking member;
  forming a sacrificial layer on the peripheral insulating layer and the light blocking member each on the peripheral passivation layer;
  removing the sacrificial layer on the peripheral insulating layer, the light blocking member and the peripheral passivation layer;
  forming a third peripheral insulating layer on the second peripheral insulating layer, the third peripheral insulating layer covering sides of the light blocking member and the second peripheral insulating layer exposed at the first and second exposure holes; and
  forming a second peripheral wire on the third peripheral insulating layer, the second peripheral wire in contact with the first peripheral wire,
  wherein the second peripheral insulating layer at the second exposure hole exposes an upper surface of the light blocking member adjacent to the first exposure hole.

13. The manufacturing method of claim 12, wherein:
in a plan view, the first exposure hole is within the second exposure hole.

14. The manufacturing method of claim 12, wherein:
a width of the upper surface of the light blocking member exposed by the second peripheral insulating layer is about 10 micrometers to about 20 micrometers.

15. The manufacturing method of claim 12, wherein:
the first peripheral wire is a common voltage line.

16. The manufacturing method of claim 12, wherein:
the second peripheral wire is connected to a common electrode of the display region.

17. The manufacturing method of claim 12, wherein:
the second peripheral wire is electrically connected to the exposed portion of the first peripheral wire exposed by each of the peripheral passivation layer, the light blocking member and the second peripheral insulating layer.

18. The manufacturing method of claim 12, wherein before the removing the sacrificial layer on the peripheral insulating layer, the light blocking member and the peripheral passivation layer:
the forming a sacrificial layer includes disposing the formed sacrificial layer in contact with the upper surface of the light blocking member exposed at the first exposure hole by the second peripheral insulating layer at the second exposure hole.

19. The manufacturing method of claim 12, wherein before the removing the sacrificial layer on the peripheral insulating layer, the light blocking member and the peripheral passivation layer:
the forming a peripheral passivation layer on the first peripheral insulating layer and the forming light a blocking member on the peripheral passivation layer exposes a portion of the first peripheral insulating layer, and the forming a sacrificial layer includes disposing the formed sacrificial layer in contact with the portion of the first peripheral insulating layer exposed by the peripheral passivation layer and the light blocking member.

* * * * *